United States Patent
Czech et al.

(10) Patent No.: US 6,891,206 B2
(45) Date of Patent: May 10, 2005

(54) LATERAL THYRISTOR STRUCTURE FOR PROTECTION AGAINST ELECTROSTATIC DISCHARGE

(75) Inventors: Martin Czech, Freiburg (DE); Jürgen Kessel, Freiburg (DE); Eckart Wagner, Voerstetten (DE); Ulrich Theus, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/780,976

(22) Filed: Feb. 9, 2001

(65) Prior Publication Data

US 2001/0019138 A1 Sep. 6, 2001

(30) Foreign Application Priority Data

Feb. 10, 2000 (DE) ........................................ 100 05 811

(51) Int. Cl.⁷ ........................ H01L 29/74; H01L 31/111; H01L 23/62
(52) U.S. Cl. ........................ 257/141; 257/146; 257/162; 257/173; 257/140; 257/362
(58) Field of Search .................................. 257/141, 146, 257/162, 173, 140, 355, 356, 362, 363; 438/133

(56) References Cited

U.S. PATENT DOCUMENTS

| | | | |
|---|---|---|---|
| 5,072,273 A | 12/1991 | Avery | 357/38 |
| 5,455,436 A | 10/1995 | Cheng | 257/356 |
| 5,903,420 A | 5/1999 | Ham | 361/56 |
| 5,903,424 A | 5/1999 | Tailliet | 361/111 |
| 5,905,288 A | 5/1999 | Ker | 257/355 |
| 6,172,404 B1 * | 1/2001 | Chen et al. | 257/363 |
| 6,215,135 B1 | 4/2001 | Schröder | 257/173 |
| 6,492,208 B1 * | 12/2002 | Cheng et al. | 438/133 |

* cited by examiner

*Primary Examiner*—Steven Loke
(74) *Attorney, Agent, or Firm*—O'Shea, Getz & Kosakowski, P.C.

(57) ABSTRACT

To protect against electrostatic discharges in monolithic integrated circuits in CMOS technology, a lateral thyristor structure is presented which has a much lower firing voltage compared to conventional thyristor structures.

8 Claims, 4 Drawing Sheets

LATERAL THYRISTOR STRUCTURE FOR PROTECTION AGAINST ELECTROSTATIC DISCHARGE

BACKGROUND OF THE INVENTION

The invention relates to the field of semiconductor devices, and in particular to a lateral thyristor structure for protection against electrostatic discharge.

FIG. 1 illustrates a block diagram of a circuit arrangement for protection against electrostatic discharge. The circuit arrangement includes at least one interior circuit 4 that requires protection, two supply terminals 1, 2, and one terminal 3 for input or output. In the event of an electrostatic discharge (ESD) in the input/output, a damaging voltage/current can reach the functional elements of the interior circuit 4. The discharge of damaging voltage/current can also reach the supply lines 1, 2 through bipolar parasitic elements, which are always present. In both cases irreversible damage can be done to the integrated circuit. Consequently, clamping devices 5 are typically attached to the supply connections 1, 2, to protect the supply lines and the elements associated therewith. Integrated circuits generally have a certain amount of self-protection through inherent parasitic bipolar elements, but this is generally insufficient protection.

In the case of circuits that operate with high supply voltages (e.g., 8 V), and thus have special high-voltage transistors with a drift zone, the inherent parasitic elements often trigger too late or not at all in order to adequately protect the circuit. Therefore, as a practical matter self-protection does not exist and the input/output 3 can be damaged by ESD.

German initial Patent Disclosure DE 41 35 522 discloses adding a clamping circuit 6 to the input/output for clamping against a supply line 2. In the event of an electrostatic discharge (ESD), this reduces the voltage at the input/output to a tolerable value and arrests the discharge. As a rule, a clamping circuit also protects the other supply connection 1, for example with a diode 7. For most input/output circuits, only a parallel protector is feasible, since as a rule a series resistor must not be inserted. Thyristors, field oxide transistors, or diodes are often used as protection elements.

A problem with diodes is that the voltage at the diode can become quite large in the case of high currents, especially in the non-conducting direction. As a result, sensitive gate oxides and diffusions in the interior circuit that is being protected may be damaged. Furthermore, diodes are rather cumbersome due to their large area, especially in the case of integrated circuits with several inputs and/or outputs.

Field oxide transistors can clamp the voltage. However, depending on the external or internal circuitry of the input/output, after firing the field oxide transistor in the application circuit may remain in a low-ohm state with average voltage, thus interfering with the function of the input/output. For example, if an external source can deliver sufficient current at high voltage, it can happen that a transient at the input/output triggers the clamping element and it is no longer quenched, due to the soft firing characteristic of the field oxide transistor structure. However, this disturbs the function of the circuit to such an extent that only turning it off and then on again quenches the field oxide transistor structure and reestablishes the original functionality of the circuit.

Transistors without any special firing arrangement draw so much current in their switched-on state ("hard firing characteristic") that the external-internal source is strongly loaded and the thyristor quenches due to the voltage collapse of the source. However, the protective effect is limited by a relatively high firing voltage so it is possible for the circuit to be damaged before the firing voltage is reached.

A special high-voltage thyristor that includes a high-voltage transistor as the firing element clamps the voltage to levels low enough that no sensible external/internal circuitry can cause a "stuck condition". However, the high-voltage transistor fires so late due to the drift zone that sensitive structures may be damaged. For example, FIG. 2 illustrates a cross sectional view of a prior art lateral thyristor structure for protection against electrostatic discharge. An example of such a prior art device is disclosed in the paper entitled "A Process-Tolerant Input Protection Circuit for Advanced CMOS Processes" by R. N. Rountree, EOS/ESD Symposium Proceedings, 1988, pages 201–205. The lateral thyristor structure is integrated into a weakly p-doped semiconductor substrate 10. The weakly p-doped semiconductor substrate 10 is electrically connected to a cathode 16, via the substrate contact 19 that is a strongly p-doped region. A weakly n-doped well region 11 is diffused into the weakly p-doped semiconductor substrate 10.

A first strongly n-doped region 12 is diffused into the surface of the weakly p-doped semiconductor substrate 10. This n-doped region is also connected to the cathode 16.

A strongly p-doped region 13 and a strongly n-doped region 14 are diffused into the surface of the weakly n-doped well region 11. The strongly p-doped region 13 and the strongly n-doped region 14 are both electrically connected to an anode 17.

The strongly p-doped region 13 and the strongly n-doped region 14 adjoin one another. A field oxide region 15 is situated between the first strongly n-doped region 12 and the strongly p-doped region 13. The field oxide region 15 is situated spatially above the pn junction which is formed between the weakly n-doped well region 11 and the weakly p-doped semiconductor substrate 10. Finally, the lateral thyristor structure is spatially separated from other semiconductor structures, which are not shown here, which are introduced into the semiconductor substrate 10, and which form the circuit that is being protected.

The strongly n-doped region 12 forms the emitter of a pnp transistor; the weakly p-doped semiconductor substrate 10 forms the base of the npn transistor; and the weakly n-doped well region 11 forms the collector of the npn transistor. The weakly p-doped semiconductor substrate 10 furthermore forms the collector of a pnp transistor. The weakly n-doped well region again forms the base for this pnp transistor. Finally, the strongly p-doped region 13 forms the emitter of this pnp transistor.

When the voltage between the anode 17 and the cathode 16 is less than about 50 volts, the pn junction between the weakly n-doped well region 11 and the weakly p-doped semiconductor substrate 10 is nonconducting, so that the lateral thyristor structure conducts only a very small current. However, if the voltage between the anode 17 and the cathode 16 exceeds approximately 50 volts, an avalanche breakdown occurs so charge carriers are generated at the pn junction between the weakly n-doped well region 11 and the weakly p-doped semiconductor substrate 10. This avalanche breakdown generates charge carriers at the base-collector junctions of the two bipolar transistors, namely the npn transistor and the pnp transistor, so the lateral thyristor fires.

Therefore, there is a need for a thyristor structure to protect against electrostatic discharge, which has a low firing voltage and does not remain stuck in its switched-on state.

SUMMARY OF THE INVENTION

Briefly, according to the present invention a lateral thyristor structure for protection against electrostatic discharge includes a semiconductor substrate of a first conduction type, with a surface and a well region of a second conduction type that is opposite to the first one and is introduced into the surface of the semiconductor substrate. A first strongly doped region of a second conduction type is introduced into the surface of the semiconductor substrate, and is electrically connected to a first terminal. A second strongly doped region of a first conduction type is introduced into the well region and is electrically connected to a second terminal. A third strongly doped region of another, second conduction type is introduced into the well region, and is electrically connected to the second terminal. Finally, a fourth strongly doped region of the second conduction type is introduced into the surface of the semiconductor substrate and into the well region, and is spatially situated above the pn junction that is formed between the semiconductor substrate and the well region, and between the third strongly doped region and the first strongly doped region.

Since the inventive lateral thyristor structure for protection against electrostatic discharge has a firing voltage of approximately 12 volts, it achieves effective protection even for VLSI circuits in CMOS technology, whose transistors have thin gate oxides and short channel lengths.

This low ignition voltage of approximately 12 volts is achieved in that the electric field between the semiconductor substrate and the fourth strongly doped region of the second conduction type, which is introduced into the surface of the semiconductor substrate and into the well region, is higher than the electric field between the well region and the semiconductor substrate. This results in an avalanche breakdown between the semiconductor substrate and the fourth strongly doped region that is introduced into the surface of the semiconductor substrate and into the well region. The charge carriers generated by the avalanche breakdown make the base of an npn transistor conducting, this npn transistor being composed of the first strongly doped region of the second conduction type, the semiconductor substrate, and the well region. The well region forms the collector of the npn transistor; the semiconductor substrate forms its base; and the first, strongly doped region forms its emitter. Because the base is made conducting by the charge carriers generated from the avalanche breakdown, the npn transistor is switched on, so that current flows from the anode to the cathode in the lateral thyristor structure.

The inventive lateral thyristor structure for protection against electrostatic discharge can be incorporated into currently available CMOS processes. Thus, without great modification, especially without further masks and special steps, the lateral thyristor structure can be integrated monolithically into a CMOS integrated circuit. However, it is also contemplated that the lateral thyristor structure may be integrated into other semiconductor circuits, which are derived from other processes, for example biCMOS processes, various processes of power semiconductors, and various DRAM processes.

Field oxide regions, such as are customary in CMOS techniques, are preferably situated between the first strongly doped region and the fourth strongly doped region, and between the second strongly doped region and the fourth strongly doped region. These field oxide regions are generated in CMOS technologies by the thermal oxidation of silicon. For this purpose, the semiconductor substrate is placed into a furnace at about 1000° C., and its surface is exposed to a stream of pure oxygen or inert nitrogen with a portion of water vapor.

In one embodiment, two or more lateral thyristor structures can be integrated into the semiconductor substrate next to one another, preferably surrounded by a substrate contact ring. The second strongly doped regions of the first conduction type that are introduced into the well region are preferably placed outward so the semiconductor substrate is maintained at a defined potential around the lateral thyristor structures. This achieves effective "latch-up" protection, and thus the environment of the lateral thyristor structures is protected against unintended firing. Furthermore, the thyristors are coupled better to one another in this way, which prevents one-sided turn-off. This makes the turn-off problem less severe, and thus the current which the structure requires in the turned-on state always remains a maximum.

A further development includes exchanging regions 23 and 24, which results in a different firing behavior (later) and turn-off behavior (more current is required).

It is also possible to introduce into a field oxide region a region of the second conduction type, equipped with a terminal, the terminal being connected to the circuit that is being protected.

An advantage of the invention is that the conflict between firing behavior on the one hand and switch-off behavior on the other hand is eliminated with little expense. The invention accomplishes this by combining a field oxide transistor, with its good switch-on behavior, with a thyristor, with its good switch-off behavior.

These and other objects, features and advantages of the present invention will become more apparent in light of the following detailed description of preferred embodiments thereof, as illustrated in the accompanying drawings.

DETAILED DESCRIPTION OF THE INVENTION

Figure 3:
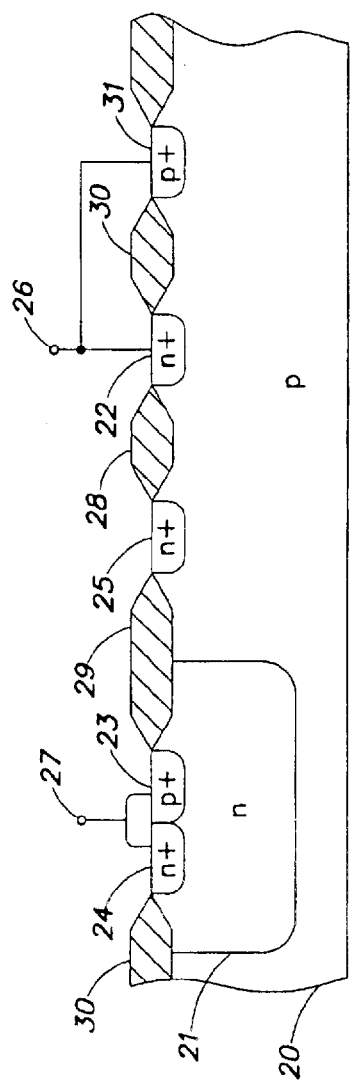
FIG. 3 illustrates a cross sectional view of an unsymmetrical lateral thyristor structure for protection against electrostatic discharge.

FIG. 3 illustrates a cross sectional view of an asymmetric lateral thyristor structure for protection against electrostatic discharge, in accordance with an aspect of the present invention. The lateral thyristor structure is introduced into the surface of a weakly p-doped semiconductor substrate. A weakly p-doped semiconductor substrate 20 is electrically connected to a cathode 26 via a substrate contact ring 31, a strongly p-doped region. A weakly n-doped well region 21 is diffused into the surface of the weakly p-doped semiconductor substrate 20. A strongly n-doped region 22 is diffused into the surface of the weakly p-doped semiconductor substrate 20, and is likewise electrically connected to the cathode 26. A strongly p-doped region 23 and a strongly n-doped region 24 are diffused into the weakly n-doped well region 21, and both are electrically connected to an anode 27.

The strongly p-doped region 23 and the strongly n-doped region 24 are situated in the weakly n-doped well region 21 and directly adjoin one another. However, it is contemplated that the strongly p-doped region 23 and the strongly n-doped region 24 in the weakly n-doped well region 21 may be spatially separated, for example by a field oxide region (not shown).

The weakly p-doped semiconductor substrate 20 includes a field oxide region 28 situated between the strongly n-doped region 22 and a strongly n-doped region 25. The strongly n-doped region 25 is introduced into the surface of the semiconductor substrate 20 and into the well region 21. It is spatially arranged above the pn junction that is formed between the weakly p-doped semiconductor substrate 20 and the weakly n-doped well region 21. The strongly n-doped region 25 may be diffused in or can be introduced by ion implantation.

A field oxide region 29 is situated in the surface of the strongly n-doped well region between the strongly n-doped region 25 and the strongly p-doped region 23. The lateral thyristor structure finally is bounded by field oxide regions 30, which spatially separate the lateral thyristor structure from other circuit components that are integrated into the semiconductor substrate 20.

The strongly n-doped region 22 forms the emitter of an npn transistor; the weakly p-doped semiconductor substrate 20 forms the base of this transistor; and the weakly n-doped well region 21 forms the collector of this npn transistor. A pnp transistor is also present in the lateral thyristor structure illustrated shown in FIG. 3. The base of this pnp transistor is formed by the weakly n-doped well region 21; the collector is formed by the weakly p-doped semiconductor substrate 20; and the emitter of this pnp transistor is formed by the strongly p-doped region 23. Both bipolar transistors have parasitic base resistances, which are created by the weakly p-doped semiconductor substrate 20 on the one hand and the weakly n-doped well region 21 on the other hand.

Figure 2:
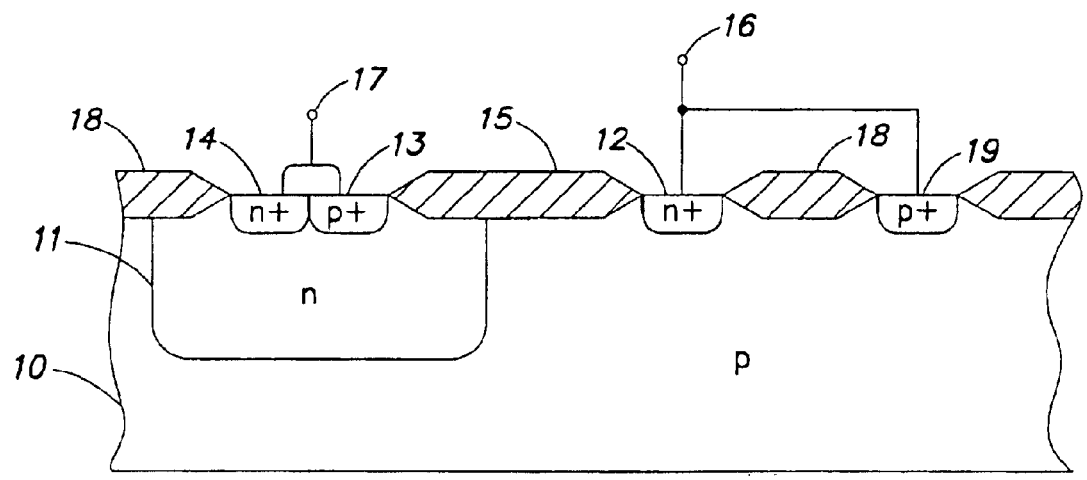
FIG. 2 illustrates a cross sectional view of a prior art lateral thyristor structure for protection against electrostatic discharge.

In comparison with the lateral thyristor structure illustrated in FIG. 2, the lateral thyristor structure illustrated in FIG. 3 requires a lower firing voltage for the thyristor, since the electric field between the strongly n-doped region 25 and the weakly p-doped semiconductor substrate 20 is higher than the electric field between the weakly n-doped well region 21 and the weakly p-doped semiconductor substrate 20. Due to this feature, an avalanche breakdown between the strongly n-doped region 25 and the weakly p-doped semiconductor substrate 20 can be created more easily than in the prior art.

The avalanche breakdown creates charge carriers between the strongly n-doped region 25 and the weakly p-doped semiconductor substrate 20. These charge carriers make the base of the npn transistor conducting, so that the npn transistor is turned on, and current begins to flow through the lateral thyristor structure from the anode 27 to the cathode 26.

The firing voltage of the lateral thyristor structure illustrated in FIG. 3 is essentially reduced to the "firing voltage" of the npn transistor, which is formed from the strongly n-doped region 25, the weakly p-doped semiconductor substrate, and the strongly n-doped region 22.

It is contemplated that in an alternative embodiment of the inventive lateral thyristor structure the regions 23 and 24 may be exchanged. This changes the characteristic of the pnp transistor 23, 21, 20, in that the effective base width is increased, and the region 24 is closer to the electronic active zone, thus reducing the base bulk resistance. Therefore, the thyristor can turn-on with a delay and to turn-off more easily. This exchange therefore is another possible way to optimize the system, but without any additional cost.

Figure 4:
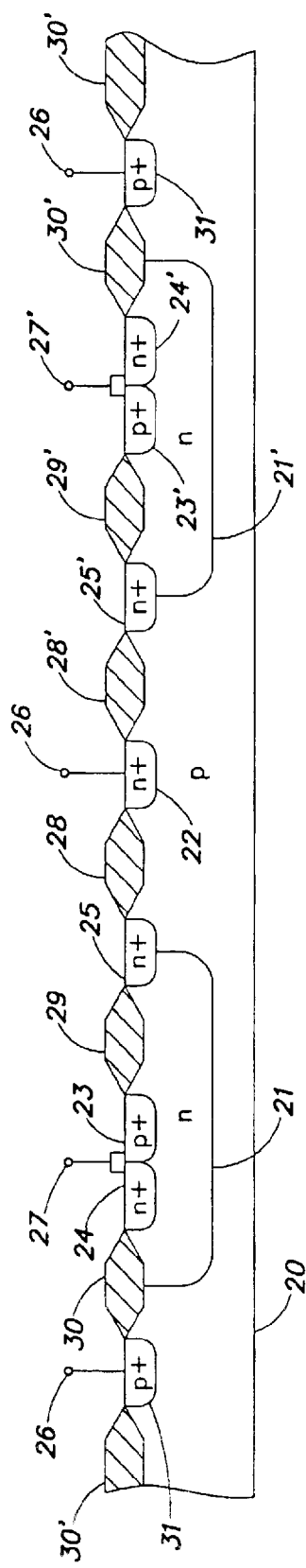
FIG. 4 illustrates a cross sectional view of a symmetric lateral thyristor structure for protection against electrostatic discharge.

Compared to FIG. 3, the embodiment of FIG. 4 is a further development in the sense that in place of an unsymmetrical structure a symmetric structure has been chosen, thus avoiding undesirable boundary effects. When the thyristors turn-off, this avoids the situation where one of the component thyristors remains "hanging" alone. This would be a problem since a single component thyristor requires only a small holding current. This is achieved especially in that the active regions of the thyristors are better decoupled from the boundary and adjoin one another more closely. If one starts from the structure of FIG. 3, then this structure is mirrored for symmetrization, for example at the cathode. This results in two essentially identical, specularly inverted structures in the weakly p-doped semiconductor substrate 20. Consequently, the "duplicated" structure has a weakly n-doped well region 21', a strongly p-doped region 23', a strongly n-doped region 24', a strongly n-doped region 25', an anode 27', and field oxide regions 28', 29' and 30'. Furthermore, the structure is surrounded by a strongly p-doped substrate contact ring 31 ("boundary") with an anode terminal 26, so that when firing during operation the entire environment will not be brought into a latch-up state. More than two thyristors can also be combined, but of course an even number of them must be used for a symmetrical design of the structure.

Figure 5:
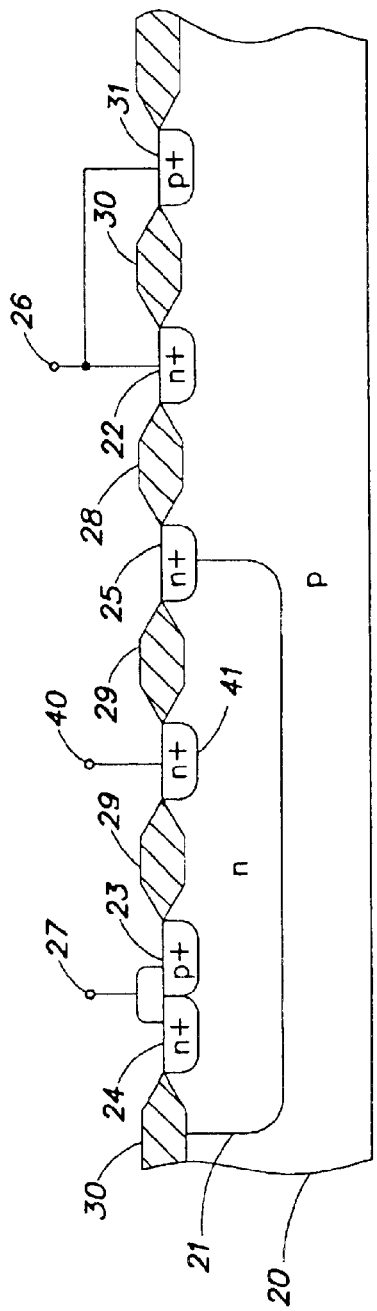
FIG. 5 is a cross sectional illustration of an unsymmetrical lateral thyristor structure for protection against electrostatic discharge in accordance with the present invention.
Figure 5A:
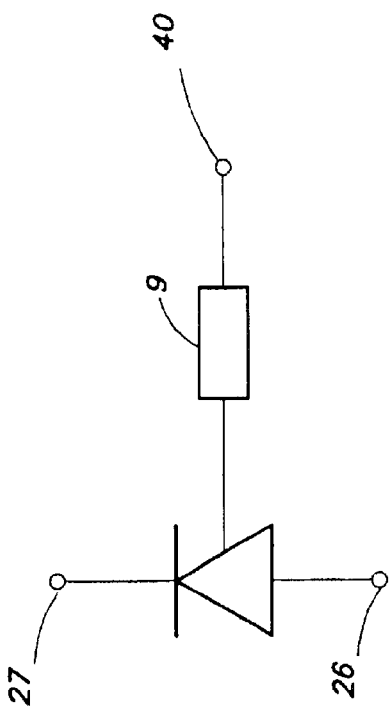
FIG. 5a illustrates an equivalent circuit of the structure illustrated in FIG. 5.

The embodiment of FIG. 5 is derived from the embodiment of FIG. 3 in that a strongly n-doped region 41 is introduced into the field oxide region 29 to divide the field oxide region 29 into two component regions, with the strongly n-doped region 20 being situated in between. The equivalent circuit diagram of such a structure is illustrated in FIG. 5a, and includes a thyristor which has an anode 26, a cathode 27, and an internal connection 40 to a resistor 9. The internal connection 40 and the resistor 9 are integrated into the thyristor by diffusion and/or implantation.

Figure 1:
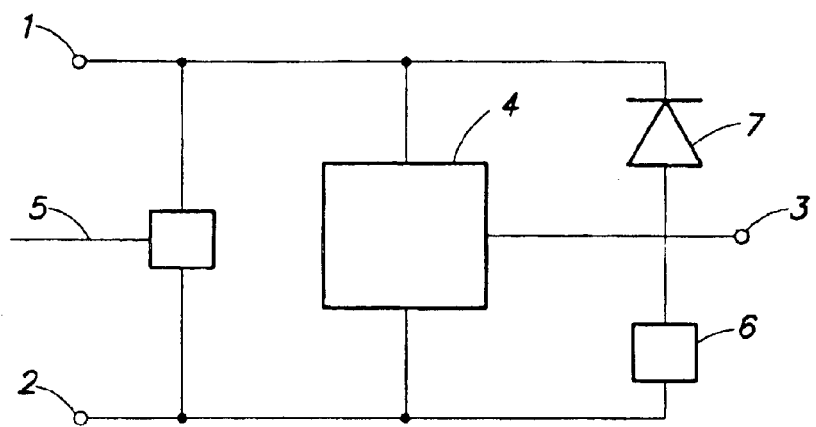
FIG. 1 illustrates a circuit arrangement for protection against electrostatic discharge.
Figure 6:
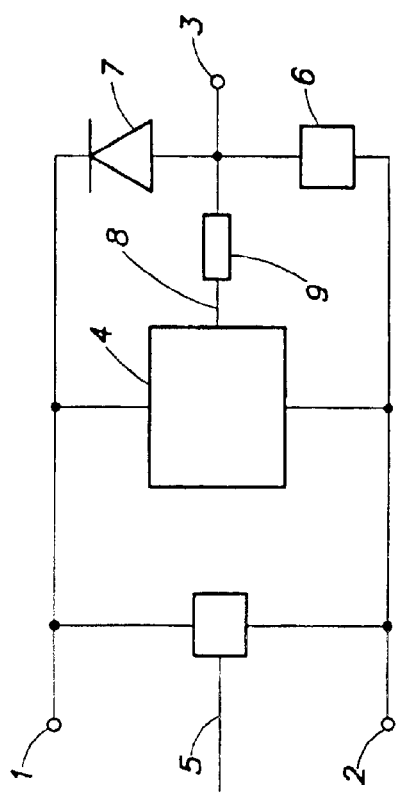
FIG. 6 illustrates a circuit arrangement of the thyristor structure of FIG. 5, in connection with the circuit arrangement, of FIG. 1, for protection against electrostatic discharge.

In the circuit of FIG. 1, an input signal (terminal 3) is present at the diode 7 and at the clamping circuit 6 (thyristor), and then passes through a metallic connection to the interior circuit 4. Consequently, the bond pad is metallically connected to the interior circuit 4. However, this harbors risks, because the bond pad generally can reach large voltages before the protective structure becomes active, after a delay time. As an alternative in accordance with FIGS. 5 and 6, the signal path is displaced into the thyristor, resulting in a tolerable series resistor 9, which, starting from FIG. 1, is connected between the corresponding connection line 8 of the interior circuit 4 and the input/output 3 (FIG. 6). Thus the interior circuit 4 does not directly "see" the voltage at the input/output 3, but rather only the voltage at the thyristor. This improves the protection of the interior circuit 4 in the case of ESD transients.

Figure 7:
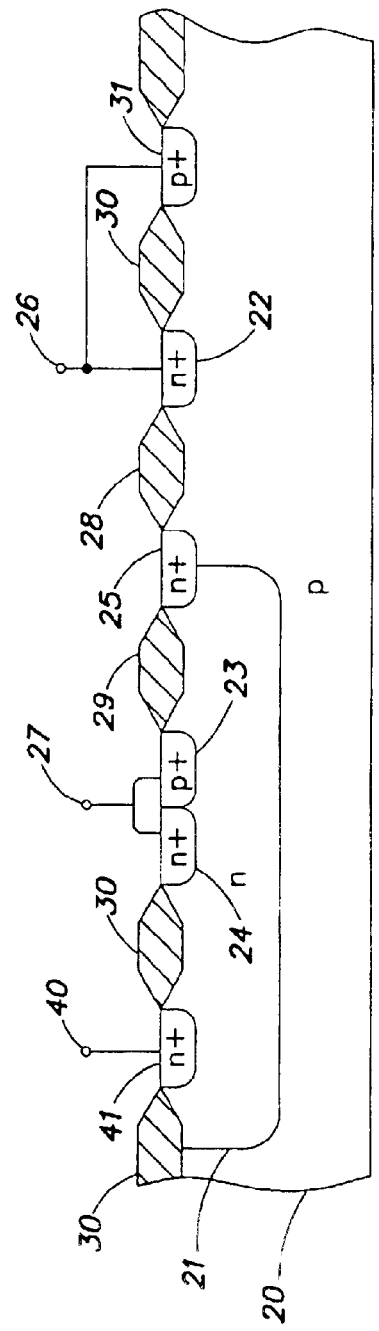
FIG. 7 is a cross sectional illustration of an alternative embodiment unsymmetrical lateral thyristor structure for protection against electrostatic discharge in accordance with the present invention.

FIG. 7 illustrates an embodiment of an inventive thyristor structure that is especially suited for applications in which a large current flows through the connecting line 8 in FIG. 6. This may result in undesirable turn-on and respectively in problems during turn-off. Compared to the embodiment of FIG. 4, the terminal 40 in the embodiment illustrated in FIG. 7 is shifted so the protective effect is indeed preserved, but the high currents on the connecting line 8 in FIG. 6 do not flow in critical regions of the thyristor (i.e., not between the anode 26 and the cathode 27). Accordingly, with a view to FIG. 3, the terminal 40, together with the strongly n-doped region 41, is introduced for example into the field oxide region 30 instead of the field oxide region 29 in the case of FIG. 5.

Accordingly, the inventive lateral thyristor structures advantageously combine the high current-carrying capacity of a thyristor with the low "firing voltage" of a field oxide bipolar transistor.

Of course, in all the structures shown and discussed here, all n conductions can be exchanged with p conductions and vice versa, without impairing the function and principle of the present invention. All the doped regions 22, 23, 24 and 25, 31, 41, as well as the discussed well region 21, can be introduced into the semiconductor substrate 20 either by diffusion or by ion implantation. Combinations of diffusion and implantation are contemplated, which likewise do not impair the function or the principle of the present invention.

Although the present invention has been shown and described with respect to several preferred embodiments thereof, various changes, omissions and additions to the form and detail thereof, may be made therein, without departing from the spirit and scope of the invention.

What is claimed is:

1. A lateral thyristor structure for protection against electrostatic discharge, comprising:
    at least two lateral thryristors, which each include
        a semiconductor substrate of a first conduction type, with a surface;
        a well region of a second conduction type, opposite to said first conduction type, which is introduced into said surface of said semiconductor substrate;
        a first strongly doped region of said second conduction type that is introduced into said surface of said semiconductor substrate and is electrically connected to a first terminal;
        a second strongly doped region of said first conduction type that is introduced into said well region and is electrically connected to a second terminal;
        a third strongly doped region of said second conduction type, which is introduced into said well region, and is electrically connected to said second terminal; and
        a fourth strongly doped region of said second conduction type, which is introduced into said surface of said semiconductor substrate and into said well region, and is spatially situated above a pn junction that is formed between said semiconductor substrate and said well region, and between said third strongly doped region and said first strongly doped region.

2. The lateral thyristor structure of claim 1, comprising a field oxide region that is situated between said first strongly doped region and said fourth strongly doped region.

3. The lateral thyristor structure of claim 1, comprising a field oxide region that is situated between said second strongly doped region and said fourth strongly doped region.

4. The lateral thyristor structure of claim 3, wherein said first conduction type is p-conducting and said second conduction type is n-conducting.

5. The lateral thyristor structure of claim 4, wherein said first terminal is connected to ground, and said second terminal is connected to a signal input line or to a signal output line.

6. The lateral thyristor structure of claim 5, wherein said at least two lateral thyristors are surrounded by a substrate contact ring.

7. The lateral thyristor structure of claim 5, wherein said at least two lateral thryristors are arranged symmetrically.

8. A symmetrical lateral thyristor structure for protection against electrostatic discharge, comprising:
    at least two lateral thyristors, which each include
        a semiconductor substrate of a first conduction type, with a surface;
        a well region of a second conduction type, opposite to said first conduction type, which is introduced into said surface of said semiconductor substrate;
        a first strongly doped region of said second conduction type that is introduced into said surface of said semiconductor substrate and is electrically connected to a first terminal;
        a second strongly doped region of said first conduction type that is introduced into said well region and is electrically connected to a second terminal;
        a third strongly doped region of said second conduction type, which is introduced into said well region, and is electrically connected to said second terminal; and
        a fourth strongly doped region of said second conduction type, which is introduced into said surface of said semiconductor substrate and into said well region, and is spatially situated above a pn junction that is formed between said semiconductor substrate and said well region, and between said third strongly doped region and said first strongly doped region.

* * * * *

UNITED STATES PATENT AND TRADEMARK OFFICE
CERTIFICATE OF CORRECTION

PATENT NO. : 6,891,206 B2
DATED : May 10, 2005
INVENTOR(S) : Czech et al.

It is certified that error appears in the above-identified patent and that said Letters Patent is hereby corrected as shown below:

Column 6,
Line 53, after "the thyristor" insert -- 42 --

Signed and Sealed this

Twelfth Day of July, 2005

JON W. DUDAS
*Director of the United States Patent and Trademark Office*